US006342932B1

(12) United States Patent
Terao et al.

(10) Patent No.: US 6,342,932 B1
(45) Date of Patent: Jan. 29, 2002

(54) LIQUID CRYSTAL DISPLAY

(75) Inventors: Shinichi Terao, Tokyo; Toshiyasu Kitamura, Kanagawa; Yutaka Masutani, Kanagawa; Katsuhisa Furukawa, Kanagawa, all of (JP)

(73) Assignee: Matshushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/438,594

(22) Filed: Nov. 12, 1999

(30) Foreign Application Priority Data

Nov. 12, 1998 (JP) ........................................ 10-322144

(51) Int. Cl.[7] .................... G02F 1/1333; G02F 1/1345; H01R 12/00; H01R 12/24

(52) U.S. Cl. ......................... 349/58; 349/150; 439/67; 439/493; 361/752

(58) Field of Search ............................ 349/58, 59, 60, 349/149, 150, 152; 439/67, 493, 66; 361/820, 760, 783, 767, 807, 808, 752

(56) References Cited

U.S. PATENT DOCUMENTS 4,695,258 A * 9/1987 Hanson et al. ................ 439/67
5,219,293 A * 6/1993 Imamura ..................... 439/67
5,353,191 A * 10/1994 Volz et al. .................. 361/690
5,358,412 A * 10/1994 Maurinus et al. ............. 439/66
5,450,221 A * 9/1995 Owen et al. .................. 349/58
5,675,397 A * 10/1997 Fukushima ................. 349/149
5,857,148 A * 6/1999 Weisshappel et al. ......... 355/90
5,990,989 A * 11/1999 Ozawa ........................ 349/61
6,000,949 A * 12/1999 Takiguchi et al. ............ 439/34
6,053,746 A * 4/2000 Yoshizawa ................... 439/67
6,077,090 A * 6/2000 Campbell et al. ............. 439/67
6,141,067 A * 10/2000 Ikka ........................... 349/65
6,191,838 B1 * 2/2001 Muramatsu .................. 349/58
6,219,116 B1 * 4/2001 Yuuki et al. .................. 349/58

FOREIGN PATENT DOCUMENTS

JP 9-288278 11/1997

* cited by examiner

*Primary Examiner*—William L. Sikes
*Assistant Examiner*—Dung Nguyen
(74) *Attorney, Agent, or Firm*—Pearne & Gordon LLP

(57) ABSTRACT

A liquid crystal display device has: a liquid crystal display unit 11; a flexible circuit board 12 which is connected to the liquid crystal display unit 11, contact portions being formed in a tip end portion of the flexible circuit board, the flexible circuit board being bent back outside a holding member 10; the holding member 10 which holds the liquid crystal display unit 11; a printed circuit board 20 to which the holding member 10 is attached, and on which contact portions are exposed; conductor-embedded elastic members 30 through which the contact portions on the printed circuit board 20 are connected to the contact portions of the flexible circuit board 12, respectively; and a corrugated elastic member 40 which is interposed between the holding member 10 and the flexible circuit board 12 to press the flexible circuit board 12. The flexible circuit board 12 is bent back outside the holding member 10 and urged by the corrugated elastic member 40, whereby the printed circuit board 20 is electrically connected to the flexible circuit board 12.

8 Claims, 4 Drawing Sheets

LIQUID CRYSTAL DISPLAY

BACKGROUND OF THE INVENTION

The present invention relates to a liquid crystal display, and particularly, to a structure of attaching and connecting a liquid crystal display unit which is configured so that, when connection terminals formed on a flexible circuit board are to be connected to a printed circuit board through a conductor-embedded elastic member, a corrugated elastic member is interposed between a holding member and the flexible circuit board, thereby enabling the attachment and the connection to be uniformly attached and conducted.

Conventionally, a conventional liquid crystal display unit is disclosed in, for example, Japanese Patent Publication (Kokai) No. HEI9-288278. As shown in FIGS. 4 and 5, in the conventional liquid crystal display device, a backlight 3 is placed on the back face of a liquid crystal display unit 1. The back light serves as a light guiding member 4 for guiding light emitted from a light emitting element 5 to illuminate the liquid crystal display unit 1 from the back side. A flexible circuit board 2 connected to the liquid crystal display unit 1 which is electrically connected to transparent electrodes via a conductive adhesive agent 7 is bent into a U-like shape. These components are fixed together by interposing members 6. Connection terminals 8 formed on the flexible circuit board 2 are drawn out to the back face and the outside of the back light 3 to be attached and connected to a connection member such as a connector which is not shown.

As describe above, the conventional liquid crystal display device is configured so that the back light 3 and the flexible circuit board 2 are fixed to each other by the interposing members 6. Therefore, a work of conducting this fixation is required, thereby producing a problem in that the production cost is increased. Furthermore, the connection terminals 8 formed on the flexible circuit board 2 are once drawn out to the outside and then attached and connected there to a connector or the like. This produces another problem in attachment and connection that the connection terminals 8 and the connector to be connected thereto must be prepared.

SUMMARY OF THE INVENTION

In order to solve the problems, it is an object of the invention to provide a display device comprises a holding member having a positioning boss and a hook for holding a liquid crystal display unit, a light guiding plate, and a flexible circuit board, a corrugated elastic member interposed between the holding member and the flexible circuit board; and connection terminals formed on the flexible circuit board attached and connected to a printed circuit board through a conductor-embedded elastic member, and which is therefore economical and has high connection reliability.

In order to solve the problems, a liquid crystal display device of the first aspect of the invention comprises: a liquid crystal display unit; a flexible circuit board which is connected to the liquid crystal display unit, contact portions being formed in a tip end portion of the flexible circuit board, the flexible circuit board being bent back outside a holding member described later; the holding member which holds the liquid crystal display unit; a printed circuit board to which the holding member is attached, and on which contact portions are exposed; conductor-embedded elastic members through which the contact portions on the printed circuit board are connected to the contact portions of the flexible circuit board, respectively; and a corrugated elastic member which is interposed between the holding member and the flexible circuit board to press the flexible circuit board, and the flexible circuit board is bent back outside the holding member and urged by the corrugated elastic member, whereby the printed circuit board is electrically connected to the flexible circuit board.

According to the first aspect of the invention, the corrugated elastic member is interposed between the holding member and the flexible circuit board to uniformly attach and connect the connection terminals formed on the flexible circuit board and the printed circuit board.

In the second aspect of the invention, a liquid crystal display device comprises: a holding member in which a positioning boss is erected from a back face, and which has a hook in a bottom portion; and a flexible circuit board which is electrically connected to transparent electrodes via a conductive adhesive agent, and in which, in a tip end portion that is bent into a substantially U-like shape, a positioning hole and contact portions are formed, the contact portions being connected to conductive elastic members described later; the holding member houses and holds, on a front side, a light guiding plate, and a liquid crystal display unit in which a liquid crystal composition is filled between a pair of substrates having transparent electrodes on inner faces, and, on a rear side, is fixed by passing the boss through the positioning hole, a main printed circuit board comprises a light emitting element, a positioning hole, and contact portions exposed on the printed circuit board, the liquid crystal display unit held by the holding member is attached and connected by: passing the positioning boss of the holding member through the positioning hole of the printed circuit board; engaging the hook with a predetermined position of the printed circuit board; and interposing a corrugated elastic member between a rear face of the holding member and the flexible circuit board, whereby contact portions disposed on the printed circuit board are connected to the contact portions disposed on the printed circuit board, through a conductor-embedded elastic members. Thus, the contact portions disposed on the printed circuit board are accurately connected to the contact portions disposed on the printed circuit board with adequate pressure.

In the third aspect of the invention, the corrugated elastic member which is interposed between the holding member and the flexible circuit board is configured evenly in a lateral direction across the boss, and the contact portions disposed on the flexible circuit board are arranged evenly in a lateral direction along a short side of the flexible circuit board. The invention has a function that the contact portions disposed on the printed circuit board, and those disposed on the flexible circuit board are correctly attached and connected in balance.

In the fourth aspect of the invention, the light emitting element disposed on the printed circuit board is housed in the holding member, and light emitted from the housed light emitting element is guided to the light guiding plate via a reflecting surface formed on the holding member. The invention has a function that light emitted from the light emitting element is guided to the light guiding plate via the reflecting surface formed on the holding member.

In the fifth aspect of the invention, the above mentioned liquid crystal display device is used in a portable telephone. Accordingly, when a liquid crystal display device is to be attached to a portable telephone, the contact portions disposed on the printed circuit board, and those disposed on the flexible circuit board are correctly attached and connected by an adequate pressure.

SUMMARY OF THE INVENTION

DETAILED DESCRIPTION OF THE EMBODIMENT

Hereinafter, an embodiment of the invention will be described with reference to FIGS. 1 to 3.

Figure 1:
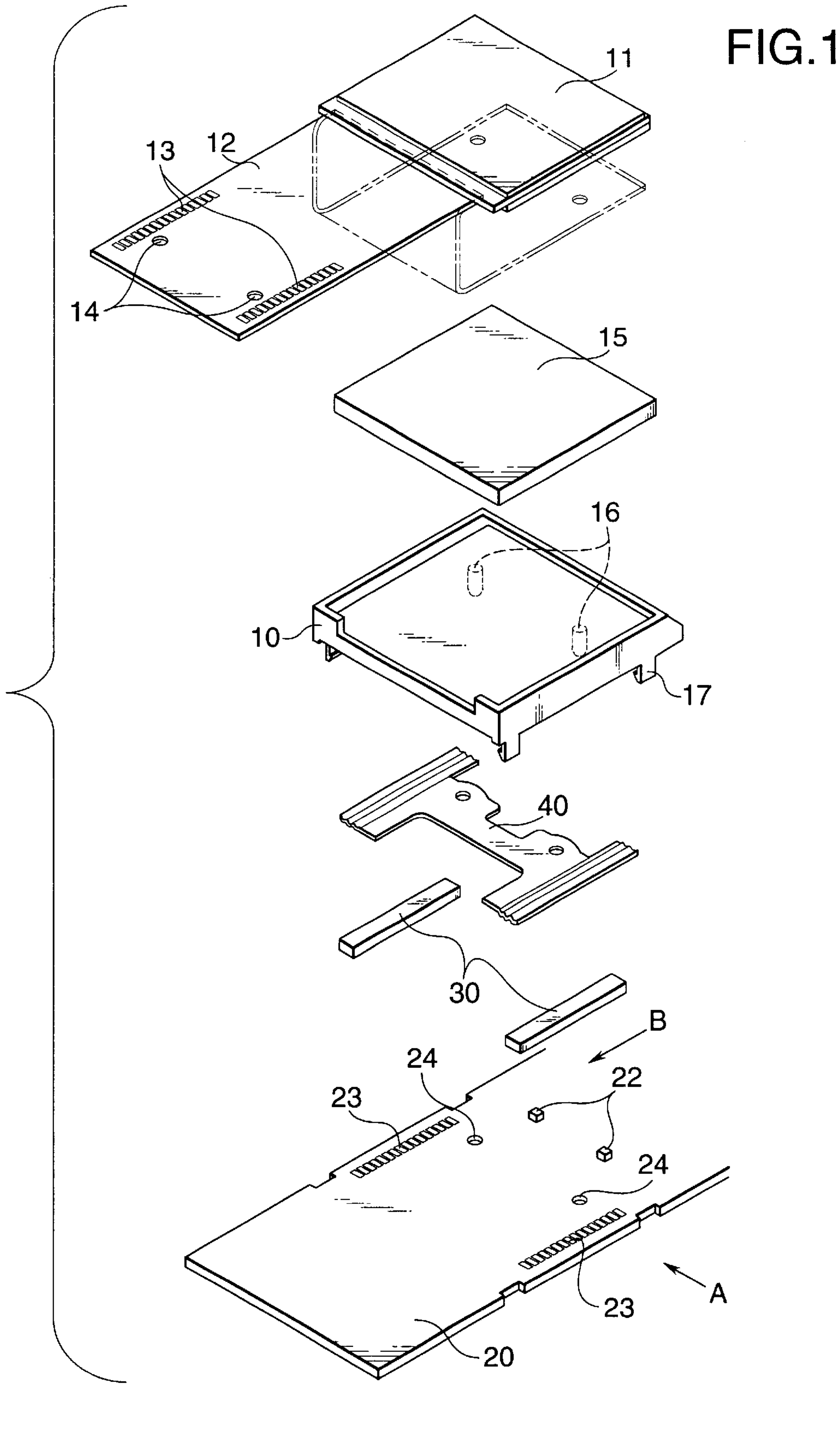
FIG. 1 is a view showing the configuration of a liquid crystal display device which is an embodiment of the invention.

FIG. 1 is a view showing the configuration of a liquid crystal display device which is an embodiment of the invention. Referring to FIG. 1, the liquid crystal display device comprises: a holding member 10 to which a liquid crystal display unit 11, a flexible circuit board 12, and a light guiding plate 15 are attached and held; a printed circuit board 20 having light emitting elements (LED chips) 22 and exposed contact portions 23; conductor-embedded elastic members 30; and a corrugated elastic member 40.

In the vicinity of the tip end of the flexible circuit board 12, contact portions 13 and positioning holes 14 are formed. In the holding member 10, hooks 17 are disposed in a bottom portion, and positioning bosses 16 are disposed on the rear face.

Next, the operation of attaching and connecting the liquid crystal display device of the embodiment of the invention will be described. Referring to FIG. 1, first, the light guiding plate 15 is placed on the surface of the holding member 10. Next, the liquid crystal display unit 11 into which the flexible circuit board 12 is incorporated is placed on the holding member 10. The flexible circuit board is previously connected to transparent electrodes of a liquid crystal display element by a conductive adhesive agent 18 or the like.

In this placement, a tip end portion of the flexible circuit board 12 is projected from a portion of a side face of the holding member 10 where an opening is set so as to correspond to the width (short side) of the flexible circuit board 12. The flexible circuit board is bent back to the rear side into a substantially U-like shape.

The corrugated elastic member 40 is previously placed on the rear face of the holding member 10. The tip end portion of the holding member 10 is placed below the corrugated elastic member 40, and then fixed with passing the positioning bosses 16 on the rear side of the holding member through the positioning holes 14 disposed in the tip end of the flexible circuit board 12. Therefore, the contact portions 13 disposed on the tip end of the flexible circuit board 12 are opposed to the exposed contact portions 23 of the printed circuit board 20.

The contact portions 13 disposed on the flexible circuit board 12 are arranged evenly in a lateral direction along a short side of the flexible circuit board, and the exposed contact portions 23 of the printed circuit board 20 are arranged evenly in a lateral direction along a short side of the printed circuit board 20.

Next, the conductor-embedded elastic members 30 also are arranged evenly in a lateral direction on the exposed contact portions 23 of the printed circuit board 20. The hooks 17 of the holding member 10 into which the liquid crystal display unit 11 and the like are incorporated as described above are engaged with recesses which are formed in predetermined positions of the printed circuit board 20, i.e., along the long sides of the printed circuit board 20. The positioning bosses 16 of the holding member 10 are passed through positioning holes 24 which are formed along the short side of the printed circuit board 20.

As a result, the contact portions 13 disposed on the tip end of the flexible circuit board 12 that is bent back to the rear side of the holding member 10 into which the liquid crystal display unit 11 and the like are incorporated and held, and the exposed contact portions 23 of the printed circuit board 20 are urged by the elastic force of the corrugated elastic member 40. The elastic force of the corrugated elastic member 40 is varied only by applying a force to the member to change the wave height, and hence has the property of applying the elastic force evenly in a predetermined range.

Figure 2:
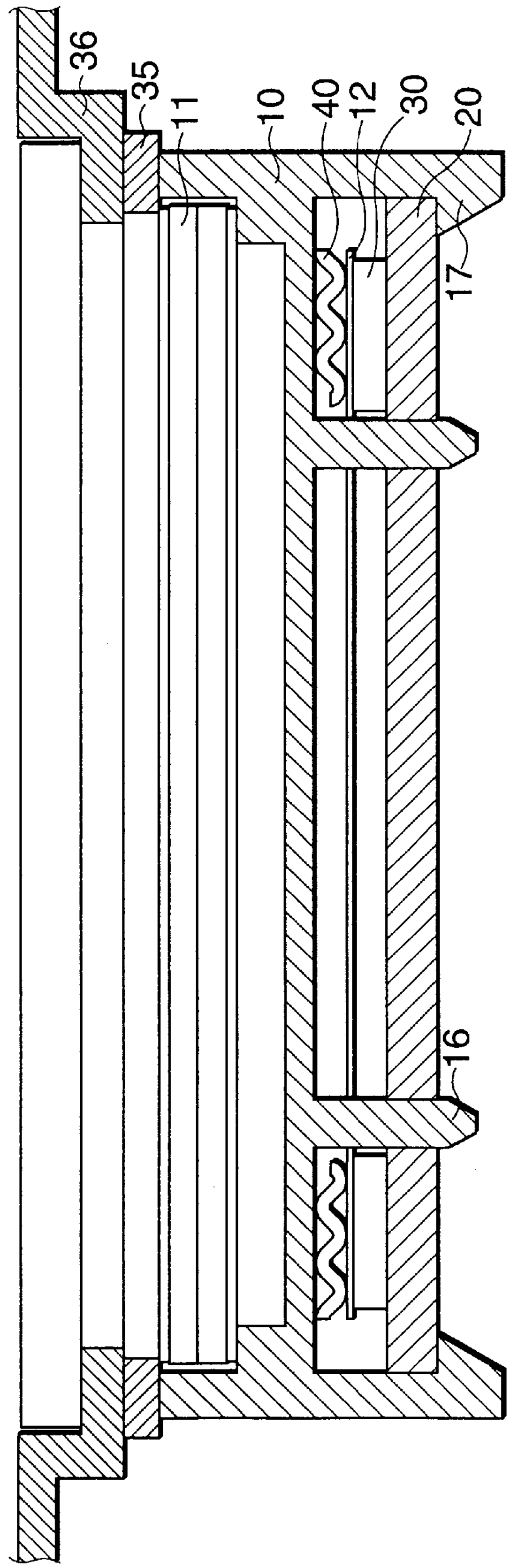
FIG. 2 is a section view of the liquid crystal display device of FIG. 1 which is the embodiment of the invention, and taken along the direction A.
Figure 3:
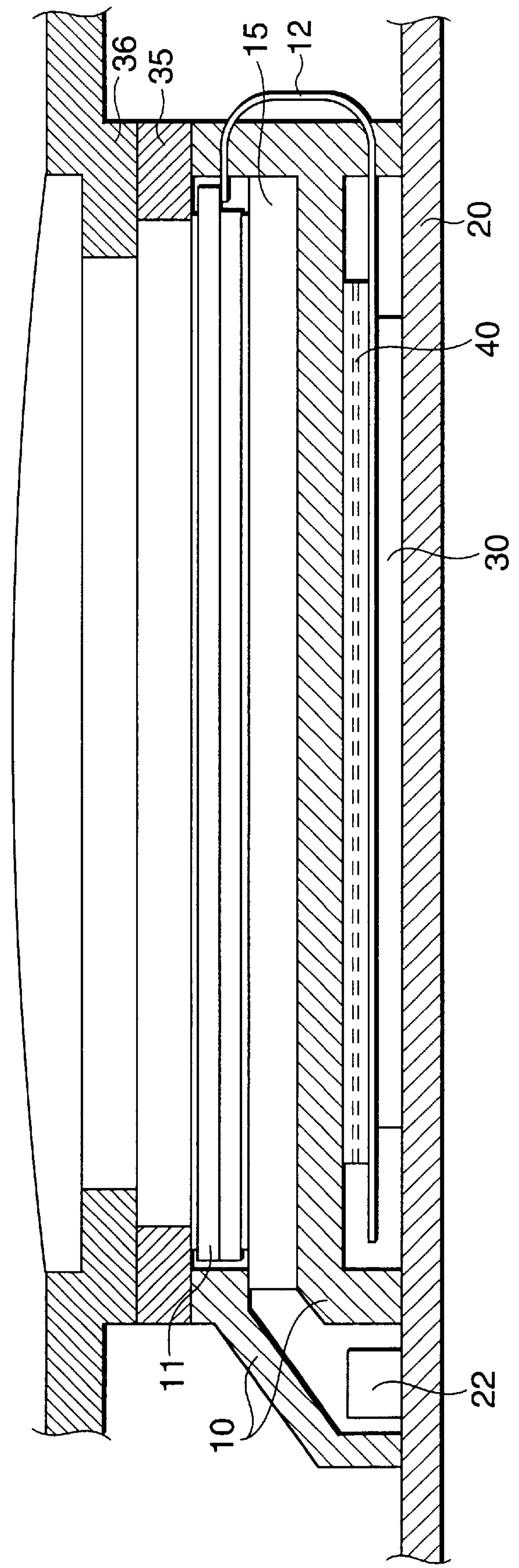
FIG. 3 is a section view of liquid crystal display device of FIG. 1 which is the embodiment of the invention, and taken along the direction B.
Figure 4:
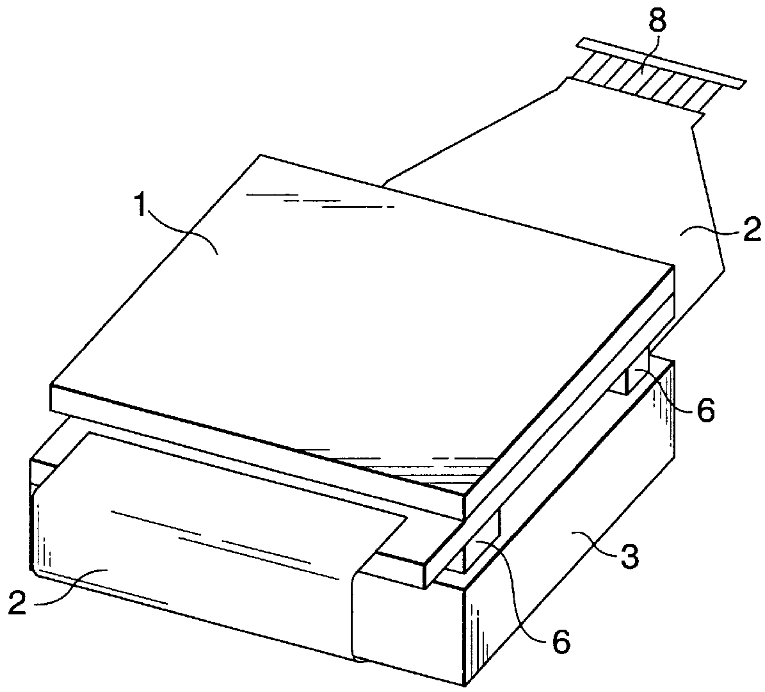
FIG. 4 is a perspective view of a conventional liquid crystal display device.
Figure 5:
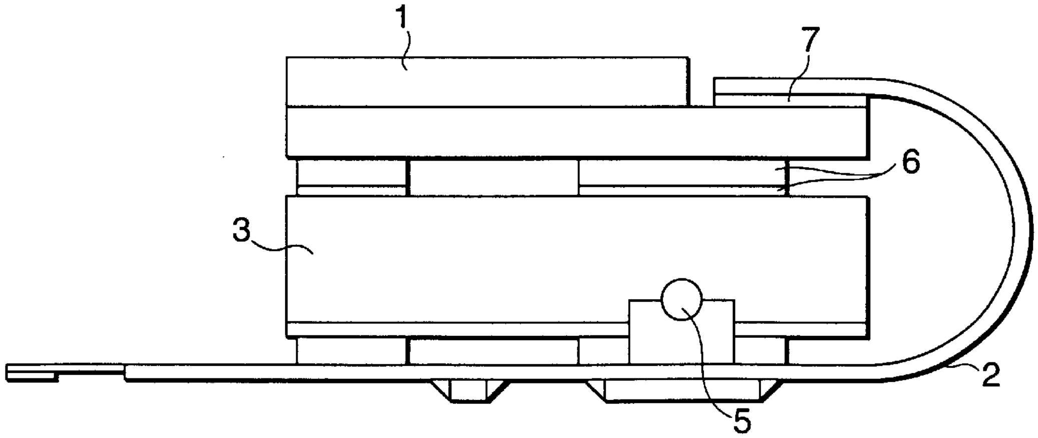
FIG. 5 is a side section view of the conventional liquid crystal display.

FIGS. 2 and 3 shows the liquid crystal display device which is attached and connected as described above. FIG. 2 is a section view of the liquid crystal display unit of FIG. 1, and taken along the direction A.

As seen from FIG. 2, the corrugated elastic member 40 is interposed between the holding member 10 and the flexible circuit board 12, the bosses 16 of the holding member 10 are passed through the positioning holes of the printed circuit board 20, the hooks 17 are engaged with the predetermined positions of the printed circuit board 20, and the connection terminals formed on the flexible circuit board are attached and connected to the printed circuit board through the conductor-embedded elastic members 30.

In the liquid crystal display unit shown in FIG. 2, actually, a glass plate and the transparent electrodes are arranged across the LCD (liquid crystal display) element. This assembly is placed on the light guiding plate 15, and below a transparent plate which is placed on a cover 36 via a cushion 35 that is disposed on the periphery of the holding member 10.

FIG. 3 is a section view of the device for attaching and connecting a liquid crystal display unit of FIG. 1, and taken along the direction B. As seen from FIG. 3, the light emitting elements (LED chips) 22 disposed on the printed circuit board 20 are housed in the holding member 10, and light emitted from the light emitting elements (LED chips) 22 is guided to the light guiding plate 15 via a reflecting surface formed on the holding member 10.

Furthermore, the manner will be seen in which the contact portions 13 disposed in the tip end of the flexible circuit board 12 are contacted and connected to the conductor-embedded elastic members 30 placed on the exposed contact portions 23 of the printed circuit board 20, by an adequate pressure exerted by the elastic force of the corrugated elastic member 40.

In the same manner as FIG. 2, in FIG. 3 also, actually, the liquid crystal display unit is configured so that the glass plate and the transparent electrodes are arranged across the LCD (liquid crystal display) element. This assembly is placed on the light guiding plate 15, and below the transparent plate which is placed on the cover 36 via the cushion 35 that is disposed on the periphery of the holding member 10.

In FIGS. 1 to 3, it is not shown that a control LSI for the liquid crystal display unit is mounted on the flexible circuit board 12. The mounting of such a control LSI is known in the fields of a TAB (Tape-Automated-Bonding), etc. Therefore, the LSI is not shown in the figures.

The thus configured liquid crystal display device of the invention comprises: a liquid crystal display unit; a flexible circuit board which is connected to the liquid crystal display unit, contact portions being formed in a tip end portion of a flexible circuit board, the flexible circuit board being bent back outside the holding member described later; the holding member which holds the liquid crystal display unit; a printed circuit board to which the holding member is attached, and on which contact portions are exposed; conductor-embedded elastic members through which the contact portions on the printed circuit board are connected to the contact portions of the flexible circuit board, respectively; and a corrugated elastic member which is interposed between the holding member and the flexible circuit board to press the flexible circuit board, and the flexible circuit board is bent back outside the holding member and urged by the corrugated elastic member, whereby the printed circuit board is electrically connected to the flexible circuit board.

This configuration attains an effect that the corrugated elastic member is interposed between the holding member and the flexible circuit board, thereby enabling the connection terminals formed on the flexible circuit board, and the printed circuit board to be uniformly attached and connected together.

What is claimed is:

1. A liquid crystal display device comprises:

a liquid crystal display unit;

a holding member which houses and holds said liquid crystal display unit;

a flexible circuit board which is connected to said liquid crystal display unit, first contact portions being formed in an edge portion of said flexible circuit board;

a printed circuit board to which said holding member is attached, and on which second contact portions are exposed;

conductor-embedded elastic members by which said second contact portions on said printed circuit board are connected to said first contact portions of said flexible circuit board, respectively; and a corrugated elastic member which is interposed between said holding member and said flexible circuit board to press said flexible circuit board;

wherein said flexible circuit board is bent back outside said holding member and urged by said corrugated elastic member, whereby said printed circuit board is electrically connected to said flexible circuit board.

2. A liquid crystal display device comprises:

a holding member in which a positioning boss is erected from a rear side, and which has a hook in a bottom portion; and a flexible circuit board which is electrically connected to transparent electrodes via a conductive adhesive agent, and in which, in an edge portion that is bent into a substantially U-like shape, a first positioning hole and first contact portions are formed, said first contact portions being connected to conductor-embedded elastic members described later; and said holding member houses and holds, on a front side, a light guiding plate, and a liquid crystal display unit in which a liquid crystal composition is filled between a pair of substrates having transparent electrodes on inner faces, and, on said rear side, said edge portion of said flexible circuit board is fixed by passing said boss through said first positioning hole, and a main printed circuit board comprises a light emitting element, a second positioning hole, and second contact portions exposed on said printed circuit board;

wherein said liquid crystal display unit held by said holding member is attached and connected to said printed circuit board by: passing said positioning boss of said holding member through said second positioning hole of said printed circuit board; engaging said hook with a predetermined position of said printed circuit board; and interposing a corrugated elastic member between said rear side of said holding member and said flexible circuit board, whereby said first contact portions disposed on said flexible circuit board are connected to said second contact portions disposed on said printed circuit board, through conductor-embedded elastic members.

3. A liquid crystal display device according to claim 2, wherein said corrugated elastic member which is interposed between said holding member and said flexible circuit board is configured evenly in a lateral direction across said boss, and said first contact portions disposed on said flexible circuit board are arranged evenly in a lateral direction along a short side of said flexible circuit board.

4. A liquid crystal display device according to claim 2, wherein said light emitting element disposed on said printed circuit board is housed in said holding member, and light emitted from said housed light emitting element is guided to said light guiding plate via a reflecting surface formed on said holding member.

5. A portable telephone comprising a liquid crystal display device comprising:

a liquid crystal display unit;

a holding member which houses and holds said liquid crystal display unit;

a flexible circuit board which is connected to said liquid crystal display unit, first contact portions being formed in an edge portion of said flexible circuit board;

a printed circuit board to which said holding member is attached, and on which second contact portions are exposed;

conductor-embedded elastic members by which said second contact portions on said printed circuit board are connected to said first contact portions of said flexible circuit board, respectively; and a corrugated elastic member which is interposed between said holding member and said flexible circuit board to press said flexible circuit board;

wherein said flexible circuit board is bent back outside said holding member and urged by said corrugated elastic member, whereby said printed circuit board is electrically connected to said flexible circuit board.

6. A portable telephone comprising a liquid crystal display device comprising:

a holding member in which a positioning boss is erected from a rear side, and which has a hook in a bottom portion; and a flexible circuit board which is electrically connected to transparent electrodes via a conductive adhesive agent, and in which, in an edge portion that is bent into a substantially U-like shape, a first positioning hole and first contact portions are formed, said first contact portions being connected to conductor-embedded elastic members described later; and said holding member houses and holds, on a front side, a light guiding plate, and a liquid crystal display unit in which a liquid crystal composition is filled between a pair of substrates having transparent electrodes on inner faces, and, on said rear side, said edge portion of said flexible circuit board is fixed by passing said boss through said first positioning hole, and a main printed circuit board comprises a light emitting element, a second positioning hole, and second contact portions exposed on said printed circuit board;

wherein said liquid crystal display unit held by said holding member is attached and connected to said printed circuit board by: passing said positioning boss of said holding member through said second positioning hole of said printed circuit board; engaging said hook with a predetermined position of said printed circuit board; and interposing a corrugated elastic member between said rear side of said holding member and said flexible circuit board, whereby said first contact portions disposed on said flexible circuit board are connected to said second contact portions disposed on said printed circuit board, through conductor-embedded elastic members.

7. A portable telephone as claimed in claim 6, wherein said corrugated elastic member which is interposed between said holding member and said flexible circuit board is configured evenly in a lateral direction across said boss, and said first contact portions disposed on said flexible circuit board are arranged evenly in a lateral direction along a short side of said flexible circuit board.

8. A portable telephone as claimed in claim 6, wherein said light emitting element disposed on said printed circuit board is housed in said holding member, and light emitted from said housed light emitting element is guided to said light guiding plate via a reflecting surface formed on said holding member.

* * * * *

UNITED STATES PATENT AND TRADEMARK OFFICE

CERTIFICATE OF CORRECTION

PATENT NO. : 6,342,932 B1
DATED : January 29, 2002
INVENTOR(S) : Terao et al.

It is certified that error appears in the above-identified patent and that said Letters Patent is hereby corrected as shown below:

Title page,
Item [73], Assignee, please delete "Matshushita", and insert -- Matsushita --.

Signed and Sealed this

Eighteenth Day of June, 2002

*Attest:*

JAMES E. ROGAN

*Attesting Officer*

*Director of the United States Patent and Trademark Office*